US012747107B2

(12) United States Patent
Choi et al.

(10) Patent No.: US 12,747,107 B2
(45) Date of Patent: Sep. 29, 2026

(54) TRANSFERRING UNIT, ARTICLE TRANSFERRING SYSTEM, AND CONTROL METHOD OF TRANSFERRING UNIT

(71) Applicant: SEMES CO., LTD., Cheonan-si (KR)

(72) Inventors: In Sung Choi, Hwaseong-si (KR); Jun Beom Lee, Hwaseong-si (KR); Dong Hoon Yang, Anyang-si (KR)

(73) Assignee: Semes Co., Ltd., Cheonan-si (KR)

( * ) Notice: Subject to any disclaimer, the term of this patent is extended or adjusted under 35 U.S.C. 154(b) by 1118 days.

(21) Appl. No.: 17/834,137

(22) Filed: Jun. 7, 2022

(65) Prior Publication Data

US 2022/0388780 A1 Dec. 8, 2022

(30) Foreign Application Priority Data

Jun. 8, 2021 (KR) ........................ 10-2021-0074353

(51) Int. Cl.
*B65G 17/20* (2006.01)
*B65G 43/00* (2006.01)
(Continued)

(52) U.S. Cl.
CPC ............. *B65G 17/20* (2013.01); *B65G 43/00* (2013.01); *B65G 47/74* (2013.01); *B66C 13/18* (2013.01);
(Continued)

(58) Field of Classification Search
CPC ........ B65G 17/20; B65G 43/00; B65G 35/00; B65G 47/74; H01L 21/67715;
(Continued)

(56) References Cited

U.S. PATENT DOCUMENTS 9,758,310 B2 9/2017 Murao
2004/0118980 A1* 6/2004 Chang ................ H01L 21/6773 246/1 C (Continued)

FOREIGN PATENT DOCUMENTS

CN 101200242 A 6/2008
CN 107055325 A 8/2017

(Continued)

OTHER PUBLICATIONS

JP-2000289978-A (Year: 2000).*

(Continued)

*Primary Examiner* — Ernesto A Suarez
*Assistant Examiner* — Laurence R Brothers
(74) *Attorney, Agent, or Firm* — Harness, Dickey & Pierce, P.L.C.

(57) ABSTRACT

The present invention provides a transferring unit traveling on a rail provided along a ceiling, the transferring unit including: a body provided with a traveling driver; traveling wheel rotated by receiving power from the traveling driver; a grip member configured to grip an article; a lifting member provided between the body and the grip member and configured to move the grip member in a vertical direction; and a controller, in which the controller lowers or raises the grip member while the transferring unit travels on the rail, in which the controller controls the lifting member and the traveling driver so that the lowering or raising of the grip member is performed in a constant speed section in which the transferring unit travels at a constant speed.

2 Claims, 14 Drawing Sheets

(51) Int. Cl.

| | |
|---|---|
| ***B65G 47/74*** | (2006.01) |
| ***B66C 13/18*** | (2006.01) |
| ***B66C 17/06*** | (2006.01) |
| ***H10P 72/30*** | (2026.01) |
| *B65G 35/00* | (2006.01) |

(52) U.S. Cl.
CPC .......... *B66C 17/06* (2013.01); *H10P 72/3202* (2026.01); *H10P 72/3218* (2026.01); *H10P 72/3221* (2026.01); *H10P 72/3222* (2026.01); *H10P 72/3408* (2026.01)

(58) Field of Classification Search
CPC ......... H01L 21/67736; H01L 21/67733; H01L 21/67706; H01L 21/6773; H01L 21/67775; B66C 13/18; B66C 17/06
See application file for complete search history.

(56) References Cited

U.S. PATENT DOCUMENTS

| | | | | |
|---|---|---|---|---|
| 2010/0065467 | A1* | 3/2010 | Murata | H01L 21/67369 267/141 |
| 2014/0067111 | A1* | 3/2014 | Vitovsky | B66C 13/18 700/228 |
| 2016/0060033 | A1 | 3/2016 | Izumi | |
| 2018/0122656 | A1* | 5/2018 | Murakami | B65G 1/0464 |
| 2020/0047998 | A1* | 2/2020 | Tanaka | H01L 21/67733 |

FOREIGN PATENT DOCUMENTS

| | | | | | |
|---|---|---|---|---|---|
| CN | 111511664 | A | | 8/2020 | |
| JP | S57-141389 | A | | 9/1982 | |
| JP | H06305686 | A | * | 11/1994 | |
| JP | H0725876 | A | * | 1/1995 | A61P 35/00 |
| JP | H07257876 | A | * | 10/1995 | |
| JP | H08-081179 | A | | 3/1996 | |
| JP | 2000033591 | A | | 2/2000 | |
| JP | 2000289978 | A | * | 10/2000 | |
| JP | 2016-050090 | A | | 4/2016 | |
| JP | 2016163001 | A | | 9/2016 | |
| JP | 2016-185862 | A | | 10/2016 | |
| JP | 2017-124885 | A | | 7/2017 | |
| JP | 2018-073174 | A | | 5/2018 | |
| KR | 10-1356569 | | | 1/2014 | |
| KR | 10-2017-0084697 | A | | 7/2017 | |
| KR | 20170084697 | A | * | 7/2017 | |
| KR | 10-2018-0048346 | A | | 5/2018 | |
| KR | 20190047905 | A | | 5/2019 | |
| KR | 10-2021-0055293 | A | | 5/2021 | |

OTHER PUBLICATIONS

KR-20170084697-A (Year: 2017).*
JP-H0725876-A (Year: 1995).*
JP-H06305686-A (Year: 1994).*
JP-H07257876-A (Year: 1995).*
Office Action for Korean Application No. 10-2021-0074353 dated Aug. 29, 2023.
Chinese Office Action issued Mar. 14, 2025 in Chinese Patent Application No. 202210645873.2.

* cited by examiner

TRANSFERRING UNIT, ARTICLE TRANSFERRING SYSTEM, AND CONTROL METHOD OF TRANSFERRING UNIT

CROSS-REFERENCE TO RELATED APPLICATIONS

This application claims priority to and the benefit of Korean Patent Application No. 10-2021-0074353 filed in the Korean Intellectual Property Office on Jun. 8, 2021, the entire contents of which are incorporated herein by reference.

TECHNICAL FIELD

The present invention relates to a transferring unit, an article transferring system, and a control method of the transferring unit.

BACKGROUND ART

In general, in order to manufacture a semiconductor device, various types of processes, such as deposition, photography, and etching, are performed, and devices performing each of these processes are arranged in a semiconductor manufacturing line. Articles, such as a substrate (for example, wafer, glass), which are objects to be processed in a semiconductor device manufacturing process, may be provided to each semiconductor processing apparatus in a state of being accommodated in a container, such as a FOUP or a POD. In addition, the articles on which the process has been performed may be collected from each semiconductor processing apparatus into a container, and the container in which the articles are collected may be transferred to the outside.

The container is transferred by a transferring vehicle, such as an Overhead Hoist Transport (OHT) apparatus. The transferring vehicle travels along rails provided along the ceiling of the semiconductor manufacturing line. The transferring vehicle transfers the container in which the article is accommodated to a load port of any one of the semiconductor processing devices. In addition, the transferring vehicle may pick up the container in which the processed article is accommodated from the load port and transfer the container to the outside, or transfer the container to another of the semiconductor processing devices.

FIG. 1 is a diagram illustrating a method in which a transferring vehicle in the related art transfers a container to a port. Referring to FIG. 1, in general, a transferring vehicle A, such as an OHT apparatus, includes a gripper G for holding a container F, a belt B connected to the gripper G, and a lifter L for winding or unwinding the belt B to lift or lower the gripper G. Further, the transferring vehicle A travels along a rail R. The transferring vehicle A seats the container F in a port P while traveling along the rail R. In FIG. 1, AP represents the traveling path of the transferring vehicle A. In addition, in FIG. 1, GP represents the movement path of the gripper G.

As can be seen from FIG. 1, the transferring vehicle A runs in the order of moving to and stopping at the upper portion of the port P, unwinding the belt B to lower the gripper G and the container F, and putting down the container F on the port P according to open and close of the ripper G, winding the belt B to raise the gripper, and starting to travel. However, in this manner, the waiting time of the transferring vehicle A is long, so that the operating efficiency of the transferring vehicle AP is degraded.

In order to solve this problem, as illustrated in FIG. 2, a method of winding or unwinding the belt B while the transferring vehicle A is traveling may be considered. In this case, there is an advantage in that the waiting time of the transferring vehicle A may be shortened, so that the operational efficiency of the transferring vehicle A may be increased. However, in this method, since the transferring vehicle A travels in a state where the length of the belt B is increased, the position of the gripper G connected to the belt B may be greatly changed. For example, FIG. 3 illustrates the change in position x of the transferring vehicle A over time t, the change in speed v of the transferring vehicle A over time t, and the change in length l of the belt B over time t, and the change in angle θ of the belt B over time t. The angle θ of the belt B means an angle between the axis perpendicular to the ground and the belt B. As illustrated in FIG. 3, it can be seen that when the length l of the belt B is changed from $t_2$ to $t_3$, which is a section in which the transferring vehicle A accelerates and decelerates, the angle θ of the belt B changes significantly. In this case, the gripper G connected to the belt B is also greatly shaken. In addition, when the gripper G is holding the container F, foreign substances, such as particles, are generated in the container F to contaminate articles, such as a substrate, or to damage the articles.

SUMMARY OF THE INVENTION

The present invention has been made in an effort to provide a transferring unit, an article transferring system, and a control method of the transferring unit, which are capable of stably transferring an article.

The present invention has also been made in an effort to provide a transferring unit, an article transferring system, and a control method of the transferring unit, which are capable of minimizing vibrations from being generated in an article or a container in which the article is accommodated.

The present invention has also been made in an effort to provide a transferring unit, an article transferring system, and a control method of the transferring unit, which are capable of shortening time for transferring an article or a container in which the article is accommodated.

The object of the present invention is not limited thereto, and other objects not mentioned will be clearly understood by those of ordinary skill in the art from the following description.

An exemplary embodiment of the present invention provides a transferring unit traveling on a rail provided along a ceiling, the transferring unit including: a body provided with a traveling driver; traveling wheel rotated by receiving power from the traveling driver; a grip member configured to grip an article; a lifting member provided between the body and the grip member and configured to move the grip member in a vertical direction; and a controller, wherein the controller configured to control the lifting member and the traveling driver to lower or raise the grip member while the transferring unit travels on the rail and the controller controls the lifting member and the traveling driver so that the lowering or raising of the grip member is performed in a constant speed section in which the transferring unit travels at a constant speed.

According to the exemplary embodiment, the lifting member may include: a belt connected with the grip member; and a lifting driver which winds or unwinds the belt.

According to the exemplary embodiment, the controller may control the traveling driver and the lifting driver so that a length of the belt is fixed in an acceleration section or a deceleration section.

According to the exemplary embodiment, the controller may control the traveling driver so that a shaking damping operation of damping shaking of the article gripped by the grip member is performed in an acceleration section in which a traveling speed of the transferring unit increases or a deceleration section in which the traveling speed of the transferring unit decreases.

According to the exemplary embodiment, the shaking damping operation may be an operation of changing a traveling acceleration of the transferring unit in a half period of a shaking period of the article.

According to the exemplary embodiment, the shaking damping operation may be an operation of changing the traveling acceleration of the transferring unit from a first acceleration to a second acceleration that is smaller than the first acceleration.

According to the exemplary embodiment, the shaking damping operation may be an operation of changing the traveling of the transferring unit from first acceleration traveling at the first acceleration to constant speed traveling and changing the traveling of the transferring unit from the constant speed traveling to second acceleration traveling at the second acceleration.

According to the exemplary embodiment, a time during which the transferring unit performs the constant speed traveling may be shorter than a time during which the transferring unit performs the first acceleration traveling or the second acceleration traveling.

Another exemplary embodiment of the present invention provides an article transferring system for transferring a container in which an article is accommodated along a ceiling of a manufacturing line in which semiconductor process devices are continuously disposed, the article transferring system including: a rail provided along the ceiling; a port configured to allow the container to be seated; a transferring unit traveling along the rail and configured to transfer the container to the port, in which the transferring unit includes: a body provided with a traveling driver; a grip member configured to grip the container; a lifting member provided between the body and the grip member and configured to move the grip member in a vertical direction; and a controller, wherein the controller configured to control the lifting member and the traveling driver to lower or raise the grip member while the transferring unit travels on the rail and the controller controls the lifting member and the traveling driver so that the lowering or raising of the grip member is performed in a constant speed section in which the transferring unit travels at a constant speed.

According to the exemplary embodiment, the lifting member may include: a belt connected with the grip member; and a lifting driver which changes a length of the belt by winding or unwinding the belt.

According to the exemplary embodiment, the controller may control the traveling driver and the lifting driver so that the length of the belt is fixed in an acceleration section in which a traveling speed of the transferring unit increases and a deceleration section in which the traveling speed of the transferring unit decreases.

According to the exemplary embodiment, the controller may control the traveling driver so that a shaking damping operation of damping shaking of the article gripped by the grip member is performed in an acceleration section in which a traveling speed of the transferring unit increases or a deceleration section in which the traveling speed of the transferring unit decreases.

According to the exemplary embodiment, the shaking damping operation may be an operation of changing a traveling acceleration of the transferring unit in a half period of a shaking period of the article.

According to the exemplary embodiment, the shaking damping operation may be an operation of changing the traveling acceleration of the transferring unit from a first acceleration to a second acceleration that is smaller than the first acceleration.

According to the exemplary embodiment, the shaking damping operation may be an operation of changing the traveling of the transferring unit from first acceleration traveling at the first acceleration to constant speed traveling and changing the traveling of the transferring unit from the constant speed traveling to second acceleration traveling at the second acceleration.

According to the exemplary embodiment, a time during which the transferring unit performs the constant speed traveling may be shorter than a time during which the transferring unit performs the first acceleration traveling or the second acceleration traveling.

Still another exemplary embodiment of the present invention provides a method of controlling a transferring unit, the transferring unit traveling on a rail provided along a ceiling of a semiconductor manufacturing line and transferring a container in which a substrate is accommodated, the transferring unit including: a traveling wheel traveling on the rail; a traveling driver for transmitting power to the traveling wheel; a grip member for gripping the container; a belt connected with the grip member; and a lifting driver for changing a length of the belt by winding or unwinding the belt, the method including: controlling the lifting driver so as to change the length of the belt in a constant speed section among the constant speed section in which the transferring unit travels at a constant speed along the rail, an acceleration section in which a traveling speed of the transferring unit increases, and a deceleration section in which the traveling speed of the transferring unit decreases.

According to the exemplary embodiment, the lifting driver may be controlled so that a length of the belt is fixed in the acceleration section and the deceleration section.

According to the exemplary embodiment, the traveling driver may be controlled so as to perform a shaking damping operation of damping shaking of the article gripped by the grip member in the acceleration section or the deceleration section.

According to the exemplary embodiment, the shaking damping operation may be an operation of changing a traveling acceleration of the transferring unit in a half period of a shaking period of the article.

Still yet another exemplary embodiment of the present invention provides a method of controlling a transferring unit to cause the transferring unit to perform following operations, the transferring unit traveling on a rail provided along a ceiling of a semiconductor manufacturing line and transferring a container in which a substrate is accommodated, the transferring unit including: a traveling wheel traveling on the rail; a traveling driver for transmitting power to the traveling wheel; a grip member for gripping the container; and a lifting driver for changing a height of the grip member, the operations including: lowering the grip member before the transferring unit reaches an upper portion of a port where the container is placed; moving the transferring unit to the upper portion of the port while a height of the grip member is fixed; and loading, by the grip member, the container to the port or unloading the container from the port.

According to the exemplary embodiment, the operations further includes: making the transferring unit deviate from the upper portion of the port while the height of the grip member is fixed; and raising the grip member after the transferring unit deviates from the upper portion of the port.

According to the exemplary embodiment, the lowering of the grip member or the raising of the grip member may be performed while the transferring unit travels.

According to the exemplary embodiment, the lowering of the grip member or the raising of the grip member may be performed while the transferring unit travels at a constant speed.

According to the exemplary embodiment, a speed of the transferring unit may be changed while the height of the grip member is fixed.

According to the exemplary embodiment of the present invention, it is possible to stably transfer an article.

Further, according to the exemplary embodiment of the present invention, it is possible to minimize vibrations from being generated in an article or a container in which the article is accommodated.

Furthermore, according to the exemplary embodiment of the present invention, it is possible to shorten time for transferring an article or a container in which the article is accommodated.

The effect of the present invention is not limited to the foregoing effects, and non-mentioned effects will be clearly understood by those skilled in the art from the present specification and the accompanying drawings.

DETAILED DESCRIPTION

Figure 1:
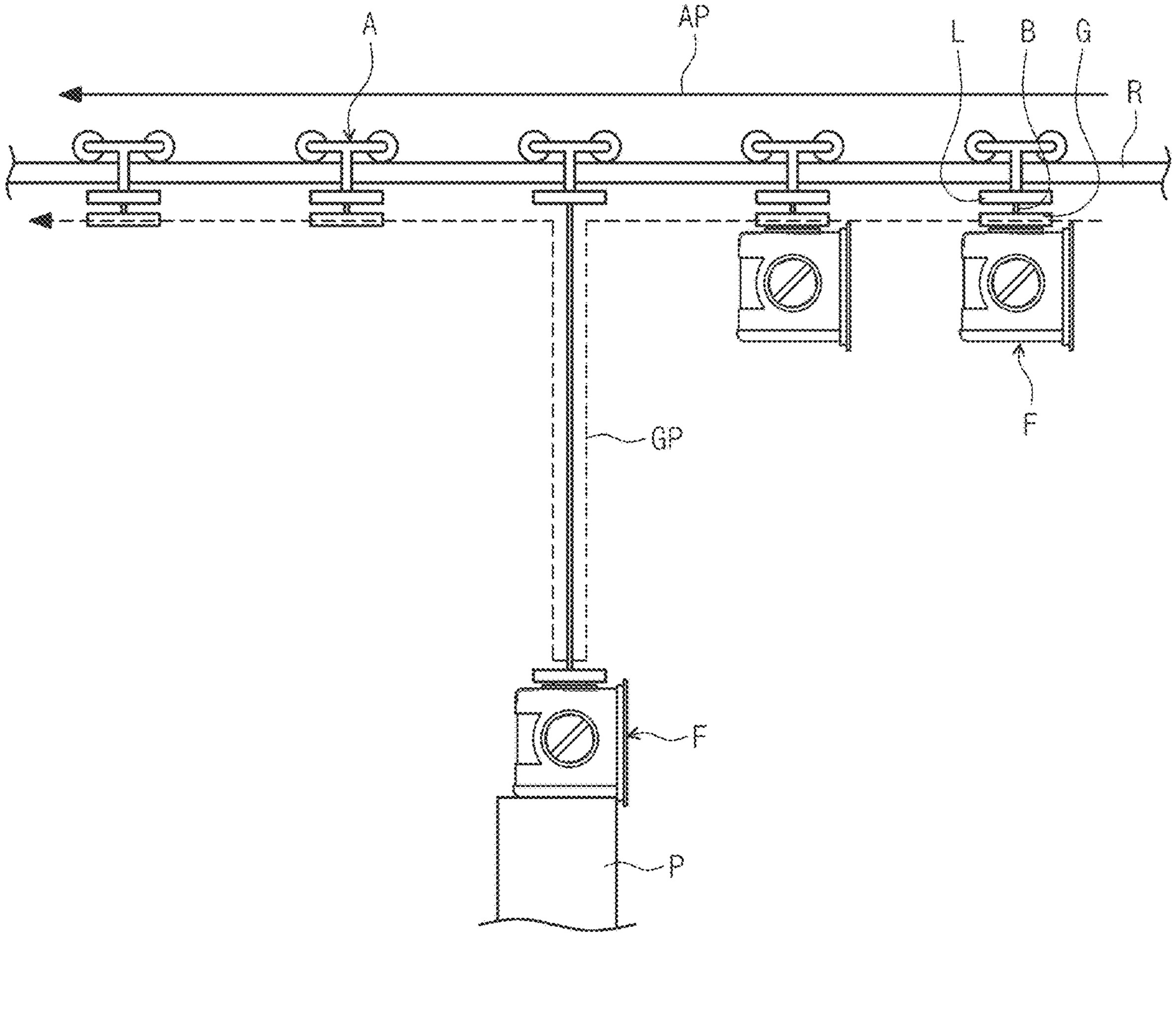
FIG. 1 is a diagram illustrating a method in which a transport vehicle in the related art transports a container to a port.
Figure 2:
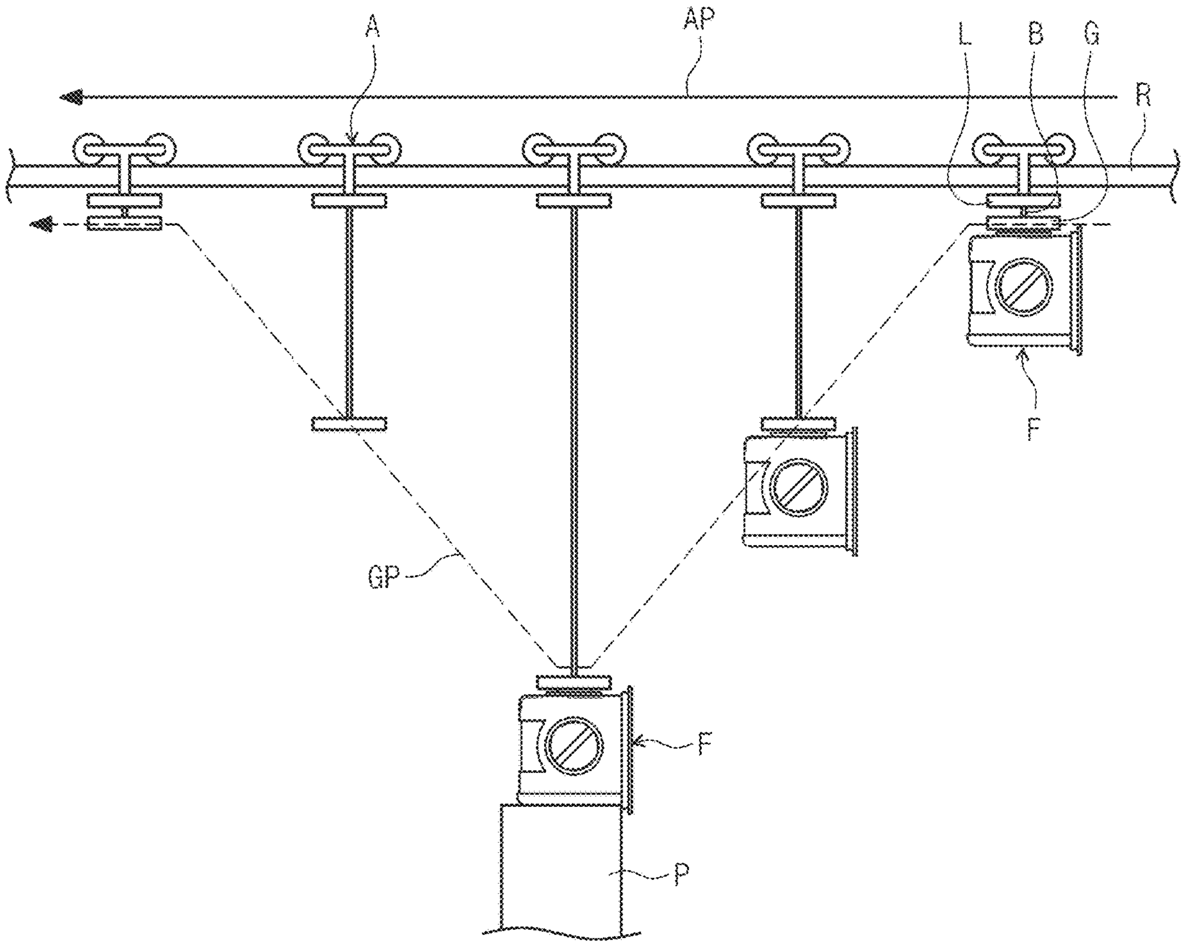
FIG. 2 is a diagram illustrating an improved method in which a transferring vehicle transfers a container to a port.
Figure 3:
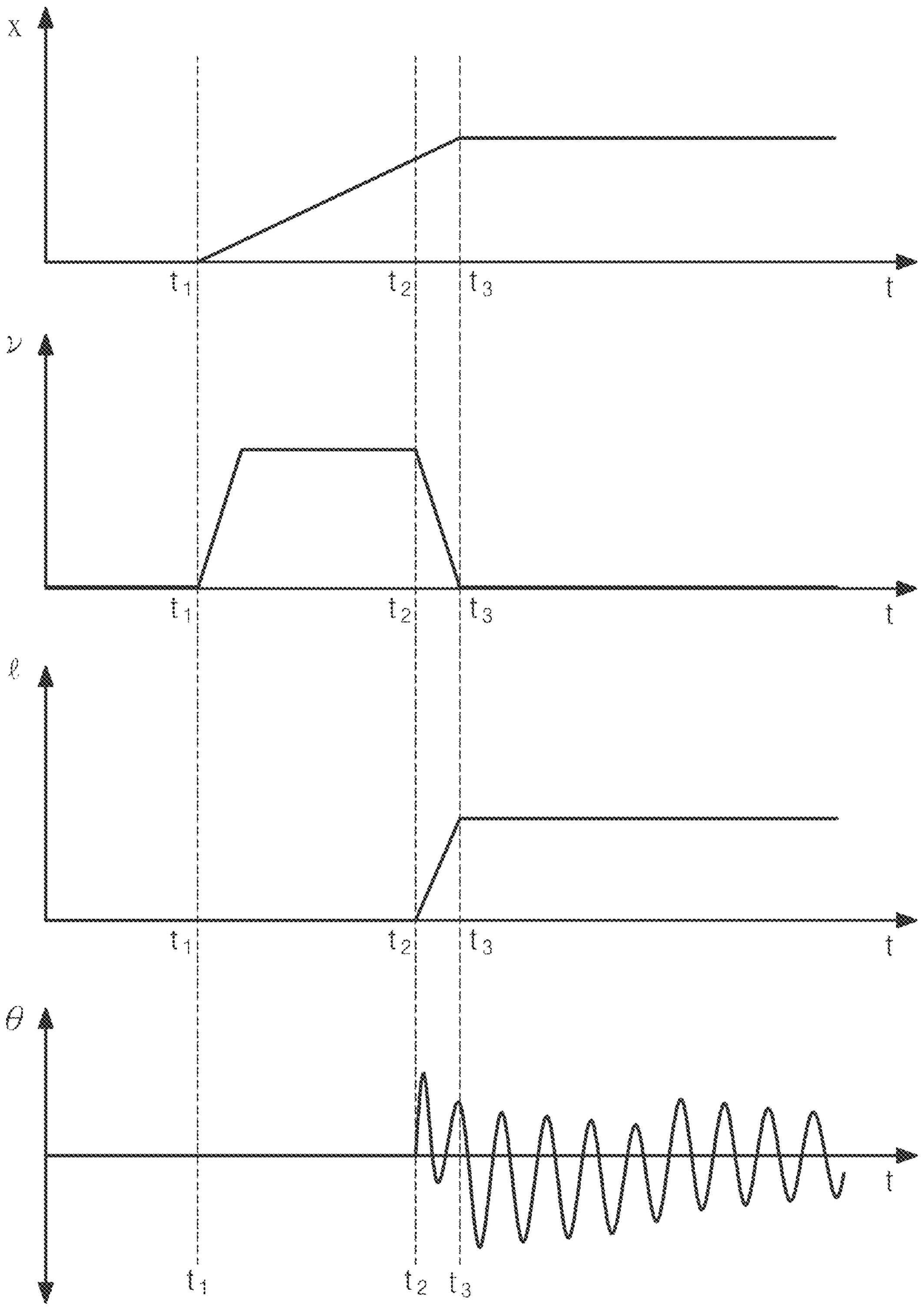
FIG. 3 is a graph illustrating a change in a position of the transferring vehicle, a change in a speed of the transferring vehicle, a change in a belt length of the transferring vehicle, and a change in a belt angle of the transferring vehicle of FIG. 2.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

An article transferring system of the present exemplary embodiment may be used to transfer a container. In particular, the article transferring system of the present exemplary embodiment transfer a container in which an article is accommodated. The article may be a substrate, such as a wafer, a glass, or a reticle. The container in which an article is accommodated may be a Front Opening Unified Pod (FOUP) or a cassette. Further, the container in which an article is accommodated may be a POD. In addition, the container in which the article is accommodated may include a magazine for accommodating a plurality of printed circuit boards, a tray for accommodating a plurality of semiconductor packages, and the like.

Hereinafter, the case in which the article transferring system transfers a container in which a substrate, such as a wafer, is accommodated to semiconductor processing devices disposed in a semiconductor manufacturing line will be described as an example. The article transferred by the article transferring device will be described based on a substrate used for manufacturing semiconductor elements as an example. However, the present invention is not limited thereto, and the article transferring device of the present exemplary embodiment may be equally or similarly applied to various manufacturing lines requiring transferring of articles and/or containers in which articles are accommodated.

Hereinafter, an exemplary embodiment of the present invention will be described in detail with reference to FIGS. 4 to 15.

Figure 4:
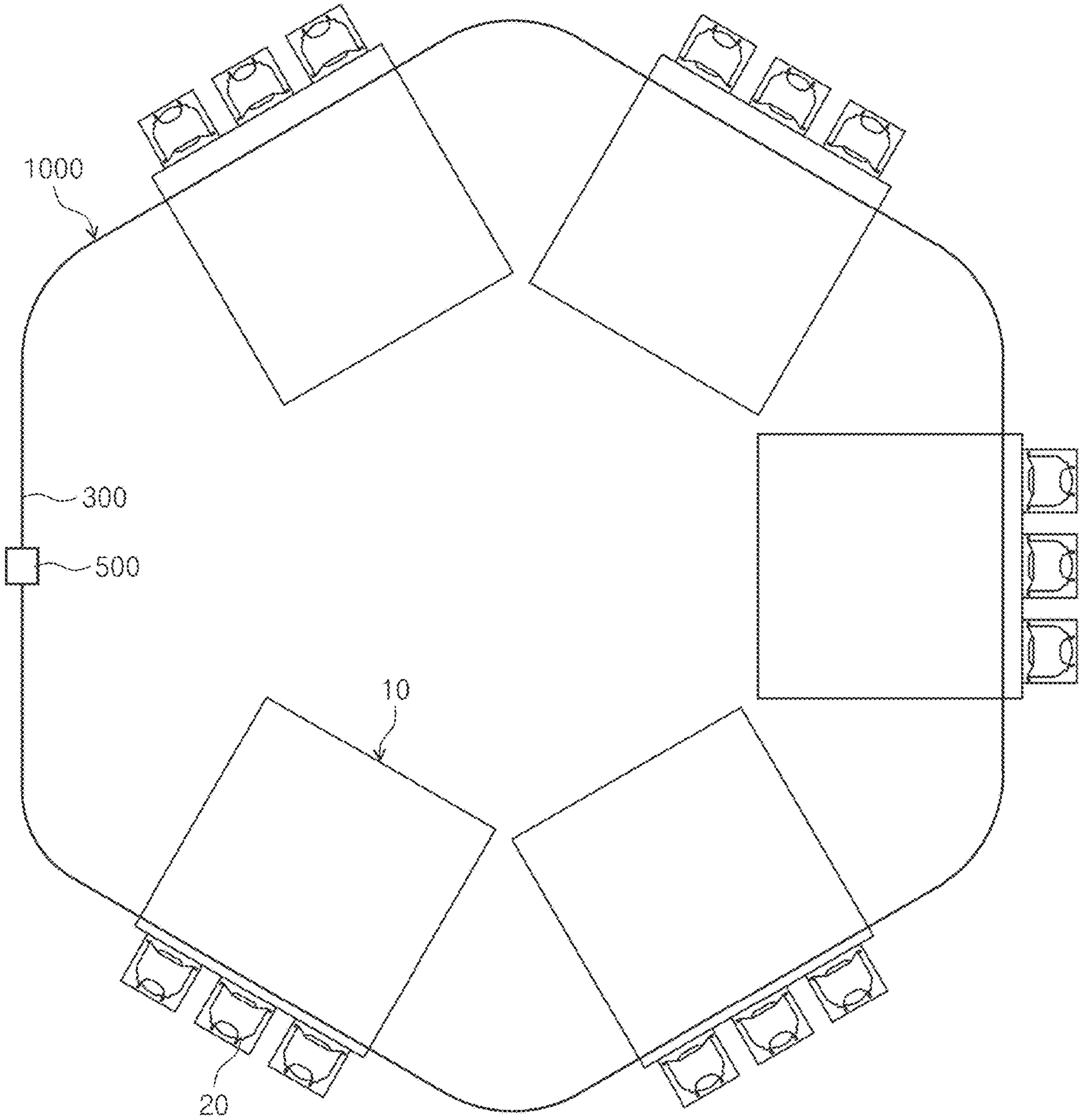
FIG. 4 is a diagram schematically illustrating a state of a semiconductor manufacturing line viewed from above.

FIG. 4 is a diagram schematically illustrating a state of a semiconductor manufacturing line viewed from above. Referring to FIG. 4, an article transport system 1000 according to the present invention may transfer a container 20 in which an article is accommodated to a semiconductor manufacturing line in which semiconductor processing apparatuses 10 are continuously arranged. The article transferring system 1000 may include a rail 300, a transferring unit 500, and a port P to be described later. The port P may be a load port that the semiconductor manufacturing apparatus 10 includes and on which the container 20 is placed. Alternatively, the port P may be a port that a container storage device (not illustrated) for storing the container 20 includes. Alternatively, the port P may be a buffer frame installed on the ceiling of a semiconductor manufacturing line.

The rail 300 provides a path along which the transferring unit 500 to be described later travels. The rail 300 may include a traveling rail 310 and a branch rail 330. The rail 300 may be fixedly installed on the ceiling of the semiconductor manufacturing line.

The transferring unit 500 may be referred to as a vehicle or a transferring vehicle. The transferring unit 500 may be an overhead hoist vehicle. The transferring unit 500 may grip the container 20. The transferring unit 500 may travel along a predetermined path along the rail 300.

In FIG. 4, the rail 300 is illustrated in a substantially hexagonal shape, but the shape of the rail 300 may be variously modified, such as a circular shape or a square shape. The rail 300 is provided along the ceiling of the semiconductor manufacturing line and may be installed so that the semiconductor processing devices 10 may be checked from above. The installation range of the rail 300 may be arranged in a wide area so that the entire semiconductor processing devices 10 can be viewed.

Figure 5:
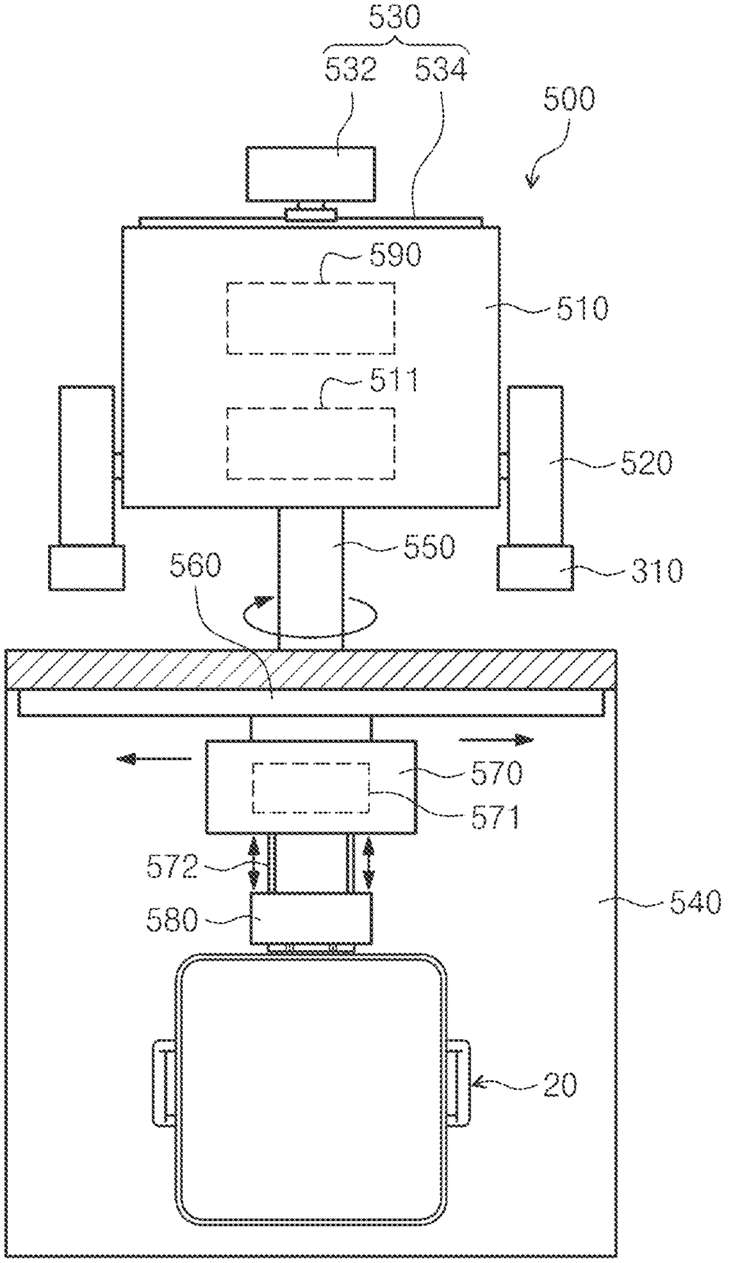
FIG. 5 is a diagram illustrating a transferring unit traveling on a rail of FIG. 4 viewed from the front.
Figure 6:
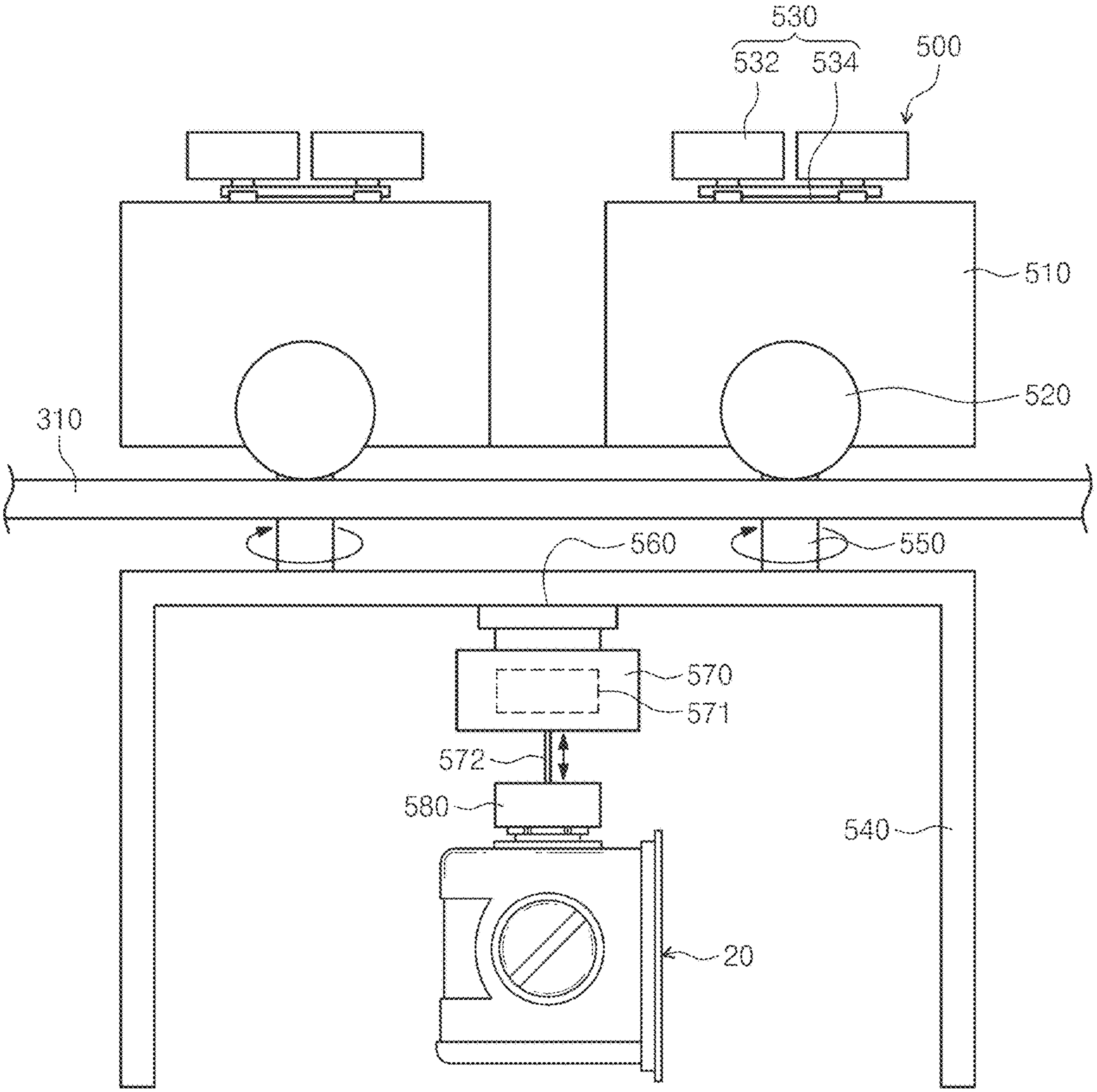
FIG. 6 is a diagram illustrating the transferring unit traveling on the rail of FIG. 4 viewed from the side.
Figure 7:
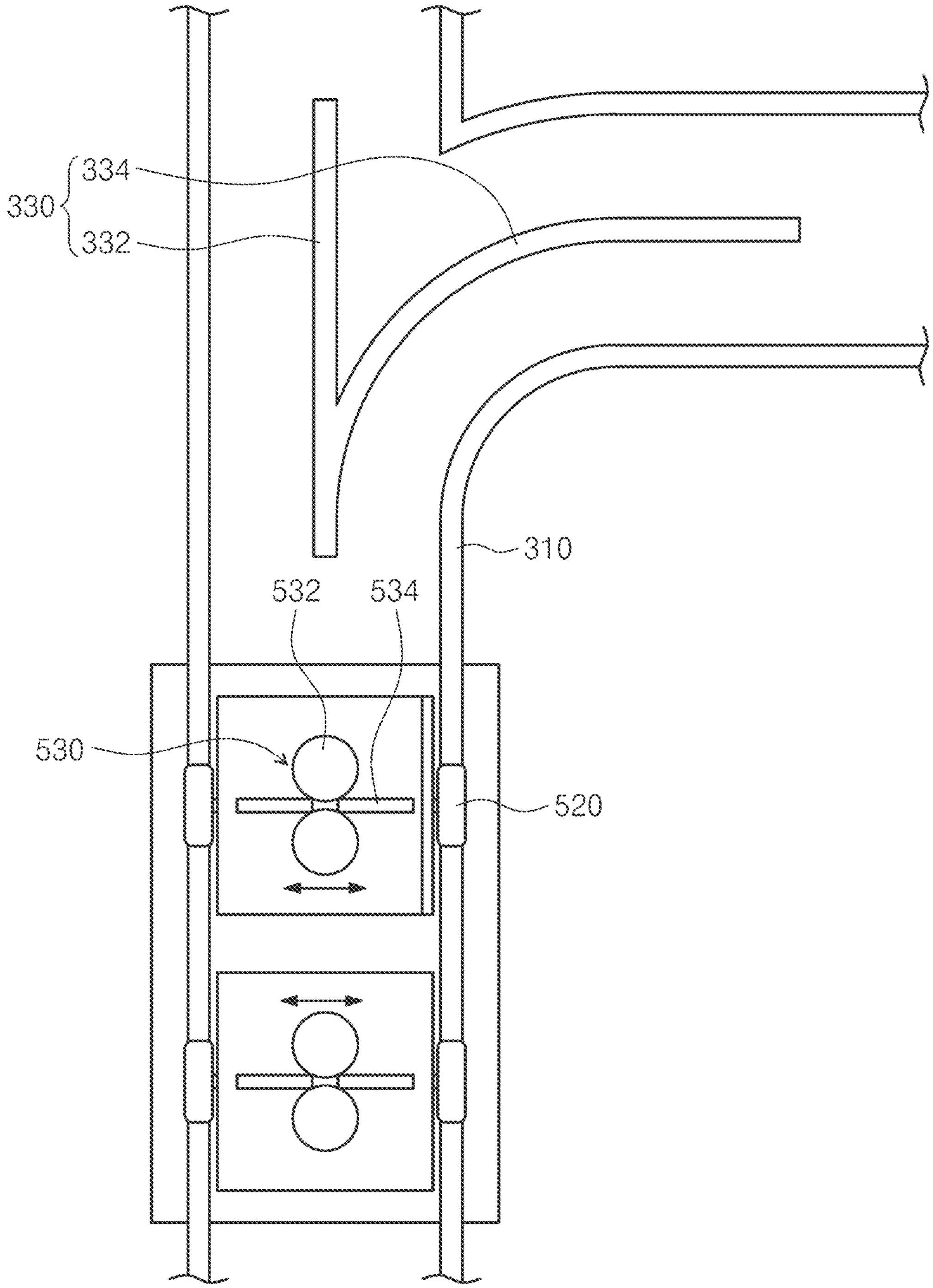
FIG. 7 is a diagram illustrating the transferring unit traveling on the rail of FIG. 4 viewed from the above.

FIG. 5 is a diagram illustrating a transferring unit traveling on a rail of FIG. 4 viewed from the front, FIG. 6 is a diagram illustrating the transferring unit traveling on the rail of FIG. 4 viewed from the side, and FIG. 7 is a diagram illustrating the transferring unit traveling on the rail of FIG. 4 viewed from the above.

Referring to FIGS. 5 to 7, as described above, the article transferring system 1000 may include the rail 300 and the transferring unit 500.

The rail 300 may include a driving rail 310 and a steering rail 330.

The traveling rail 310 may provide a traveling path along which the transferring unit 500, which will be described later, travels. A traveling wheel 520 of the transferring unit 500, which is to be described later, may be in contact with the traveling rail 310. The traveling rails 310 may be provided in plurality, and may be provided to be spaced apart from each other. For example, the traveling rails 310 may be provided as a pair. The pair of travelling rails 310 may be parallel to each other and may be provided at the same height.

The steering rail 330 may change a traveling direction of the transferring unit 500, which will be described later. The steering rail 330 may be in contact with the steering wheel 532 of the transferring unit 500 which is to be described later. The steering rail 330 may include a straight branch rail 332 and a curved branch rail 334. The straight branching rail 332 may maintain the traveling path of the transferring unit 500 in a region where the traveling rail 310 is branched. In addition, the curved branch rail 334 may maintain a traveling path of the transferring unit 500 in a region where the traveling rail 310 is branched.

The transferring unit 500 may travel on the rail 300. The transfer unit 500 may travel on the traveling rail 310. The transferring unit 500 may grip the container 20. The transferring unit 500 may travel on the rail 300 while gripping the container 20. The transferring unit 500 may include a body 510, a traveling wheel 520, a steering member 530, a frame 540, a neck 550, a slider 560, a lifting member 570, a grip member 580, and a controller 590.

The travelling wheel 520, the steering member 530, and the neck 550 may be coupled to the body 510. The travelling wheel 520 may be rotatably coupled to the body 510. In addition, the body 510 may be provided with the traveling driver 511 for rotating the traveling wheel 520. In addition, the body 510 may be provided with the controller 590 that controls the operation of the transferring unit 500. Also, the steering member 530 may be provided on the upper surface of the body 510. In addition, the neck 550 may be rotatably coupled to the body 510.

The traveling driver 511 may transmit power to the traveling wheel 520 to rotate the traveling wheel 520. In addition, a plurality of bodies 510 may be provided. Each body 510 may have the above-described traveling driver 511. In addition, the aforementioned driving wheel 520, steering member 530, and neck 550 may be coupled to each body 510.

The traveling wheel 520 may be rotatably coupled to the body 510. The traveling wheel 520 may be rotated by receiving power from the traveling driver 511. The traveling wheel 520 may be rotated while being in contact with the rail 300. The traveling wheel 520 may be coupled to the body 510. The traveling wheel 520 may be rotatably coupled to the body 510. The traveling wheel 520 may be in contact with the traveling rail 310 among the rails 300, and may be rotated to travel on the traveling rail 310. A plurality of traveling wheels 520 may be provided. The driving wheels 520 may be provided as a pair. One of the traveling wheels 520 may be rotatably coupled to one surface of the body 510, and the other of the traveling wheels 520 may be rotatably coupled to the other surface opposite to one surface of the body 510.

The steering member 530 may be provided above the body 510. The steering member 530 may include a plurality of steering wheels 532 and a steering rail 534. The steering wheel 532 may be disposed along a direction parallel to the traveling direction of the transferring unit 500 when viewed from above. In addition, the longitudinal direction of the steering rail 534 may be parallel to a direction perpendicular to the traveling direction of the transferring unit 500 when viewed from the above. Also, the position of the steering wheel 532 may be changed along the longitudinal direction of the steering rail 534.

The frame 540 may have an internal space. The slider 560, the lifting member 570, and the grip member 580, which will be described later, may be provided in the inner space of the frame 540. In addition, the frame 540 may have a hexahedral shape with both lateral surface and lower surface open. That is, a front surface and a rear surface of the frame 540 may be provided as a blocking plate. Accordingly, it is possible to prevent the container 20 held by air resistance from shaking when the transferring unit 500 travels. In addition, the frame 540 may be coupled to the body 510 via the neck 550. The neck 550 may be rotatably provided with respect to the body 510 and the frame 540. The frame 540 may be coupled to at least one body 510 via at least one neck 550. For example, one frame 540 may be provided, and two necks 550 may be coupled to one frame 540. In addition, the two necks 550 may be respectively coupled to different bodies 510, respectively.

The slider 560 may be coupled to the frame 540. The slider 560 may be coupled such that a position of the slider 560 with respect to the frame 540 may be changed. The slider 560 may be provided in the inner space of the frame 540 and may be coupled to the lower surface of the frame 540. The slider 560 may be coupled to the frame 540 so as to change the position of the slider 560 in the left and right sides with respect to the traveling direction of the transferring unit 500. Also, the slider 560 may be coupled to the lifting member 570 which is to be described later. Accordingly, the position of the lifting member 570 may be changed by changing the position of the slider 560.

The lifting member 570 may be provided between the body 510 and the grip member 580. The lifting member 570 may move the grip member 580 in the vertical direction. The lifting member 570 may raise or lower the grip member 580. The lifting member 570 may include a lifting driver 571 and a belt 572. The lifting member 570 may be referred to as a hoist device. The lifting driver 571 may change the length of the suspended belt 572 by winding or unwinding the belt 572. For example, when the lifting driver 571 unwinds the belt 572, the length of the belt 572 may be increased, and when the lifting driver 571 winds the belt 572, the length of the belt 572 may be shortened. In addition, a plurality of belts 572 may be provided. One end of each of the plurality of belts 572 may be connected to the grip member 580.

The grip member 580 may grip the container 20. When the grip member 580 is closed, the grip member 580 may grip the container 20. When the grip member 580 is opened, the grip member 580 may release the container 20. That is, the grip member 580 may detachably grip the container 20. The grip member 580 may unload the container 20 from the port P, such as a load port of a semiconductor processing device.

The controller 590 may be provided in the body 510 as described above. The controller 590 may be provided in an internal space of the body 510. The controller 590 may control at least one of the components of the transferring unit 500, for example, the traveling driver 511, the lifting driver 571, and the slider 560. In addition, the controller 590 may generate a control signal for performing the control method of the transferring unit 500 to be described below.

Figure 8:
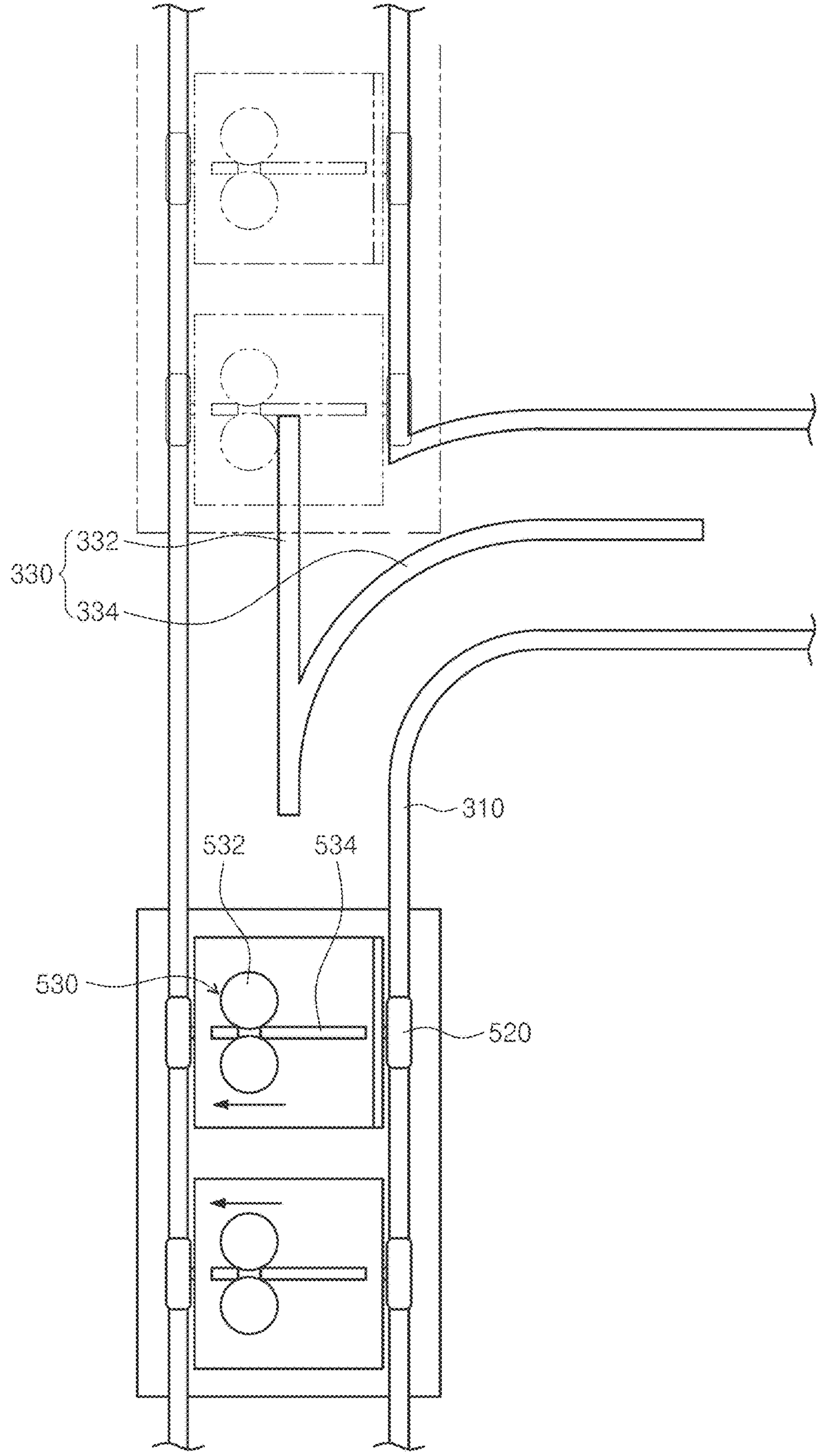
FIG. 8 is a diagram illustrating the case where the transferring unit of the present invention travels while maintaining a traveling direction in a branching area viewed from the above.

FIG. 8 is a diagram illustrating the case where the transferring unit of the present invention travels while maintaining a traveling direction in a branching area viewed from the above. Referring to FIG. 8, when the transferring unit 500 travels while maintaining the traveling direction in the branching area, the steering wheel 532 of the steering member 530 is moved to a position that is in contact with the straight branching rail 332. Accordingly, in the branching area, the traveling wheel 520 is in contact with any one of the traveling rails 310, the steering wheel 532 is in contact with the straight branching rail 332, and the traveling direction of the transferring unit 500 is maintained.

Figure 9:
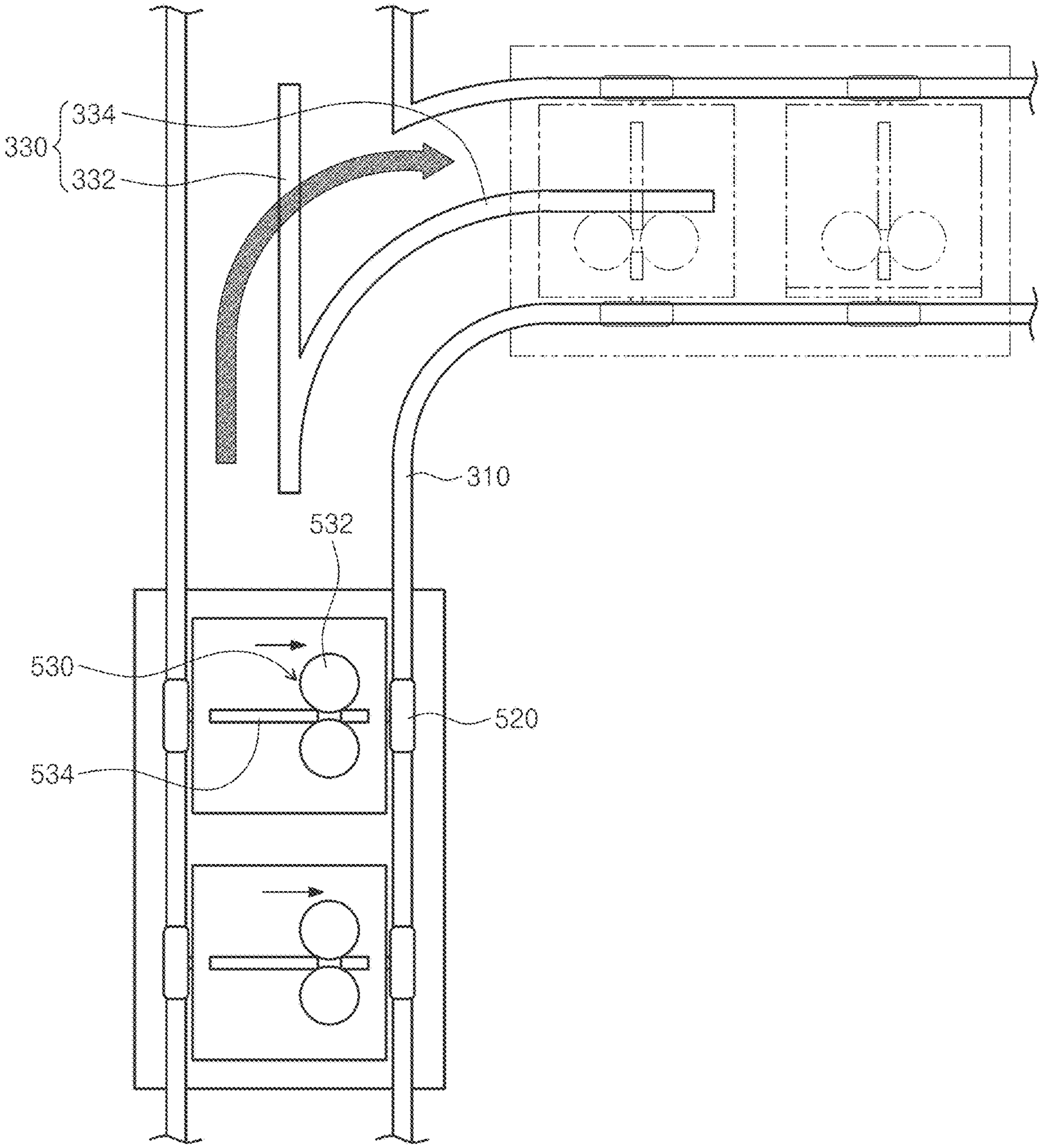
FIG. 9 is a diagram illustrating the case where the transferring unit of the present invention travels while changing the traveling direction in the branching area viewed from the above.

FIG. 9 is a diagram illustrating the case where the transferring unit of the present invention travels while changing the traveling direction in the branching area viewed from the above. Referring to FIG. 9, when the transferring unit 500 changes the traveling direction in the branching area, the steering wheel 532 of the steering member 530 is moved to a position that is in contact with the curved branching rail 334. Accordingly, in the branching area, the traveling wheel 520 is in contact with any one of the traveling rails 310, the steering wheel 532 is in contact with the curved diverging rail 334, and the traveling direction of the conveying unit 500 is changed.

Hereinafter, a method of controlling the transferring unit 500 according to an exemplary embodiment of the present invention, more particularly, a control method of the transferring unit 500 for performing an article transferring method will be described in detail.

Figure 10:
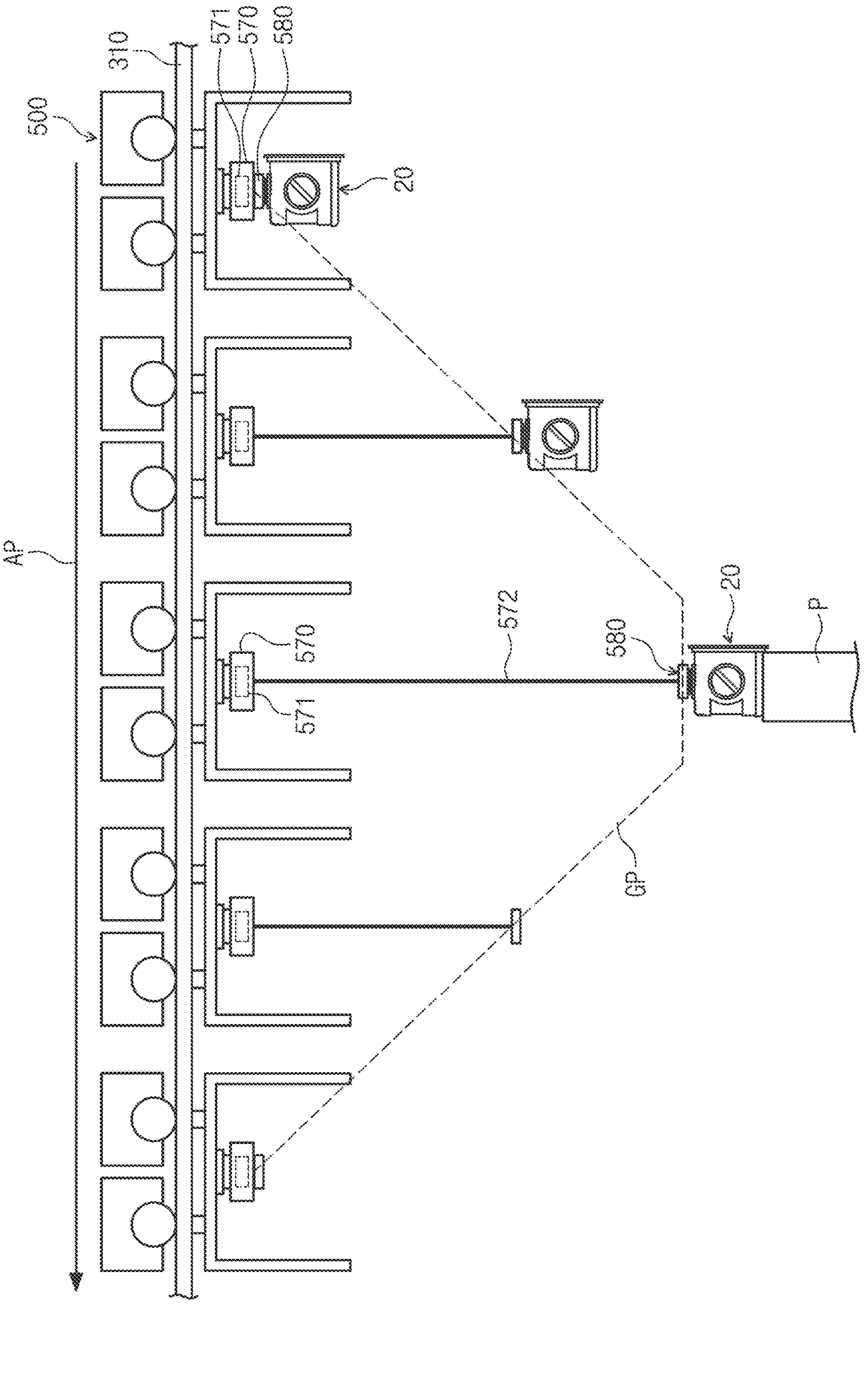
FIG. 10 is a diagram illustrating a state in which the transferring unit of the present invention transfers a container in which an article is accommodated.

FIG. 10 is a diagram illustrating a state in which the transferring unit of the present invention transfers a container in which an article is accommodated. In FIG. 10, the AP represents a traveling path of the transferring unit 500. GP represents a movement path of the grip member 570. Referring to FIG. 10, the transferring unit 500 may transfer the container 20 in which the article is accommodated to the port P. The transfer unit 500 may move along the traveling rail 310 to transfer the container 20 to the port P. For example, before the transferring unit 500 reaches the upper part of the port P where the container 20 is placed, the lifting driver 571 may lower the grip member 580. When the lowering of the grip member 580 is completed, the height of the grip member 580 may be fixed. While the height of the grip member 580 is fixed, the transferring unit 500 may move to the upper portion of the port P. Thereafter, the grip member 580 may load the container 20 into the port P or unload the container 20 from the port P FIG. 10 illustrates the operation in which the transferring unit 500 loads the container 20 into the port P). For example, when the transferring unit 500 stops at the upper portion of the port P, the grip member 580 may be opened. When the grip member 580 completes the operation of loading or unloading the container 20, the transfer unit 500 may start traveling. At this time, the transferring unit 500 may deviate from the upper portion of the port P while the height of the grip member 580 is fixed. After the transferring unit 500 deviates from the upper portion of the port P, the grip member 580 may move up.

The height of the grip member 580 may be changed by the lifting driver 571. Also, the operation of changing the height of the grip member 580, that is, the operation in which the lifting driver 571 winds or unwinds the belt 572 to lower or raise the grip member 280, may be performed while the transferring unit 500 is traveling. Since the height control of the grip member 580 is performed while the transferring unit 500 is traveling, the waiting time (for example, stopping time) of the transferring unit 500 may be shortened. Accordingly, it is possible to shorten the time for the transferring unit 500 to transfer the article or the container 20 in which the article is accommodated.

Figure 11:
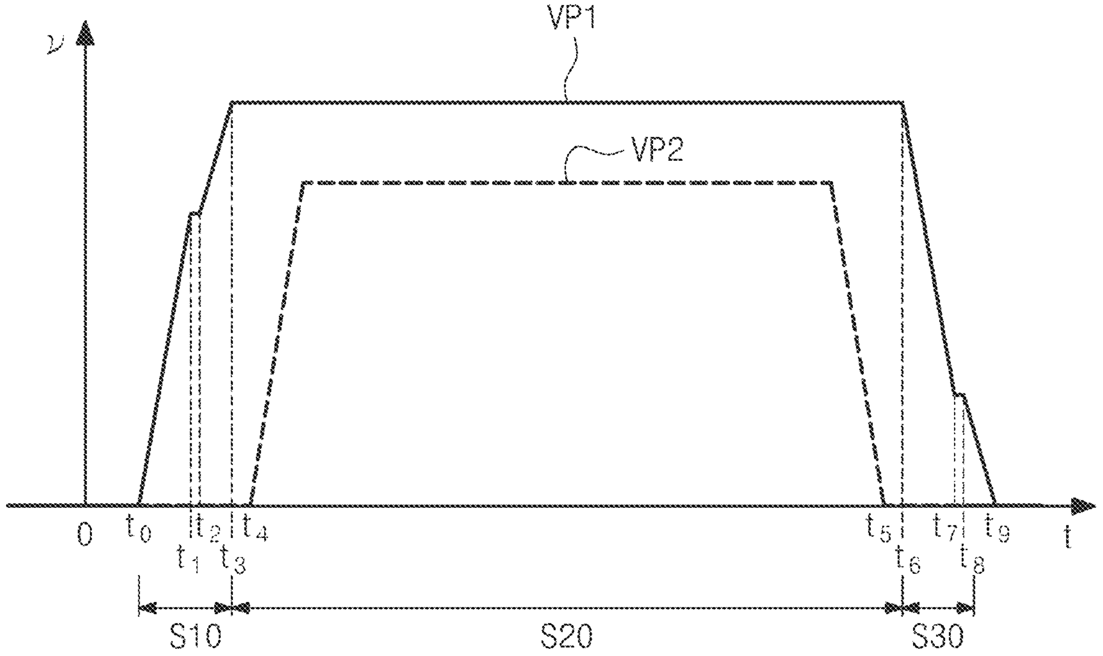
FIG. 11 is a graph illustrating a rotational speed of a traveling driver for rotating a traveling wheel and a rotational speed of a lifting driver for winding or unwinding a belt according to the present invention.
Figure 12:
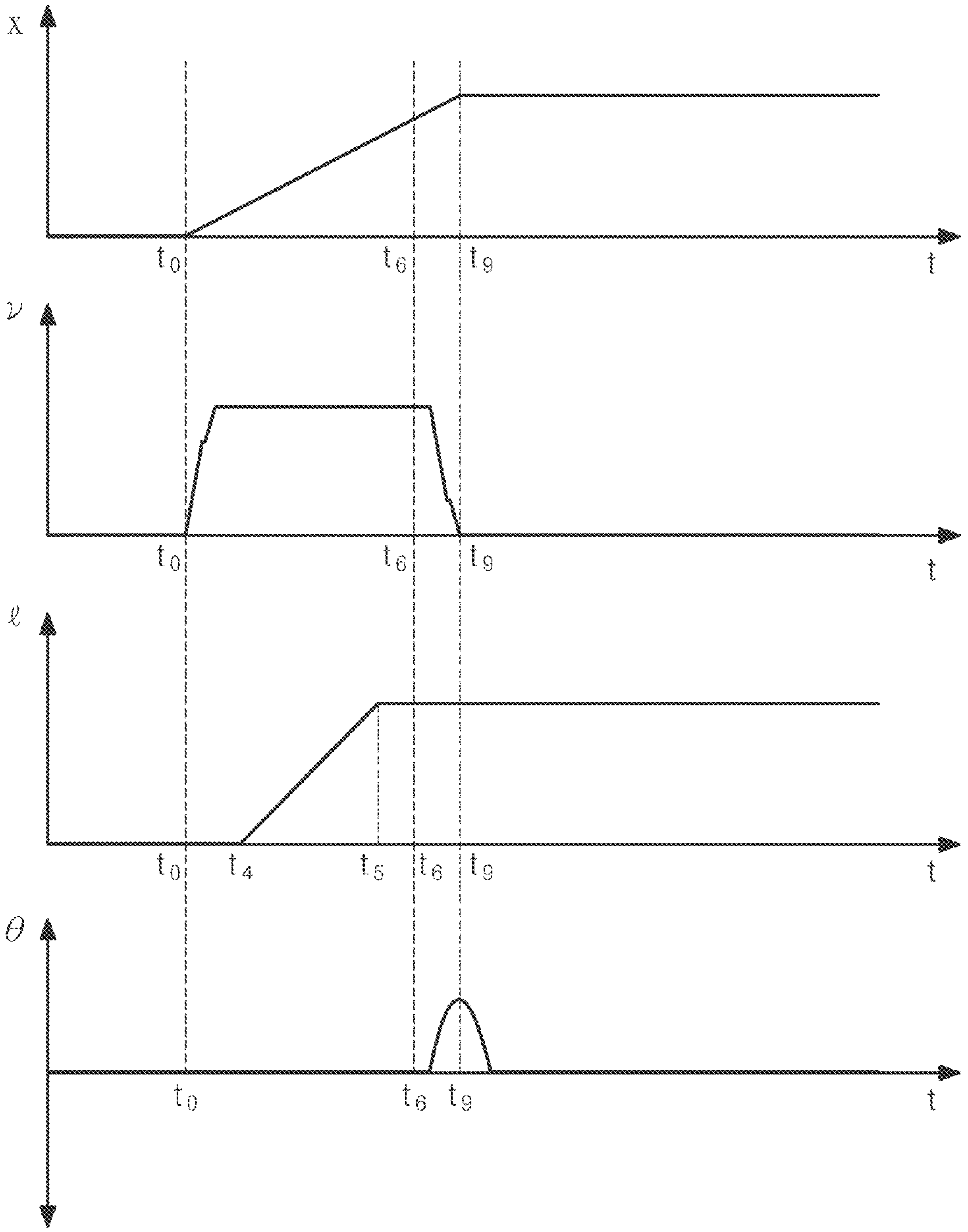
FIG. 12 is a graph illustrating a change in a position of the transferring unit, a change in a speed of the transferring unit, a change in a belt length of the transferring unit, and a change in a belt angle of the transferring unit according to the present invention.

FIG. 11 is a graph illustrating a rotational speed of a traveling driver for rotating a traveling wheel and a rotational speed of a lifting driver for winding or unwinding a belt according to the present invention, and FIG. 12 is a graph illustrating a change in a position of the transferring unit, a change in a speed of the transferring unit, a change in a belt length of the transferring unit, and a change in a belt angle of the transferring unit according to the present invention.

Although VP1 in FIG. 11 represents the rotation speed of the traveling driver 511, VP1 may represent the travel speed of the transferring unit 500. In addition, VP2 represents the rotational speed of the lifting driver 571, but VP2 may also represent the speed of change in length of the belt 572.

FIG. 12 may represent a change in position x of the transferring unit 500 over time t, and a change in speed v of the transferring unit 500, a change in length l of the belt 572 of the transferring unit 500, In addition, a change in angle θ of the belt 572 of the transferring unit 500. The angle θ may mean an angle between the longitudinal axis of the belt 572 and an axis perpendicular to the ground.

As illustrated in FIGS. 11 and 12, the traveling of the transferring unit 500 may have an acceleration section S10, a constant speed section S20, and a deceleration section S30. The acceleration section S10 ($t_0$ to $t_3$) may be a section in which the traveling speed of the transferring unit 500 is increased. The constant speed section S20 ($t_3$ to $t_6$) may be a section in which the transferring unit 500 travels at a constant speed. The deceleration section S30 ($t_6$ to $t_9$) may be a section in which the traveling speed of the transferring unit 500 is lowered. The constant speed section S20 may be a section between the acceleration section S10 and the deceleration section S30.

In the acceleration section S10 or the deceleration section S30, the transferring unit 500 may perform a shaking damping operation for damping the shaking of the container 20 gripped by the grip member 580. The shaking damping operation may be performed by changing the traveling speed of the conveying unit 500. For example, the shaking damping operation may be an operation of changing the magnitude of the acceleration of the transferring unit 500 in half the shaking period of the container 20 accommodating articles, such as a substrate.

The shaking period may be a period of shaking of the container 20 that occurs while the stopped transferring unit 500 starts traveling at $t_0$. In addition, the shaking period may be a period of shaking of the container 20 that occurs when the transferring unit 500 traveling at a constant speed starts deceleration at $t_6$.

The shaking damping operation may be an operation of changing the traveling acceleration of the transferring unit 500 from a first acceleration to a second acceleration that is smaller than the first acceleration. For example, the shake damping operation may be an operation of changing the traveling of the transferring unit from a first accelerated travel ($t_0$ to $t_1$ or $t_6$ to $t_7$) of the first acceleration to the constant speed travel ($t_1$ to $t_2$ or $t_7$ to $t_8$), and changing the traveling of the transferring unit from the constant speed travel ($t_1$ to $t_2$ or $t_7$ to $t_8$) to a second accelerated travel ($t_2$ to $t_3$ or $t_8$ to $t_9$) of the second acceleration. In addition, the time during which the transferring unit 500 travels at the constant speed ($t_1$ to $t_2$ or $t_7$ to $t_8$) may be very shorter than a time during which the transferring unit 500 performs the first accelerated travel ($t_0$ to $t_1$ or $t_6$ to $t_7$) and/or the second accelerated travel ($t_2$ to $t_3$ or $t_8$ to $t_9$).

Figure 13:
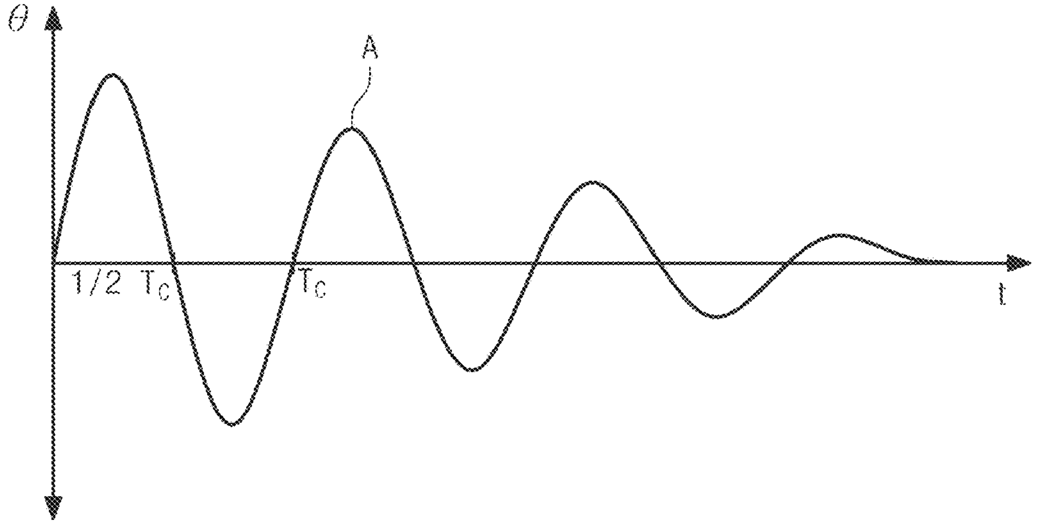
FIGS. 13, 14, and 15 are graphs illustrating a change in a belt angle for describing a shake damping operation of FIG. 11.
Figure 14:
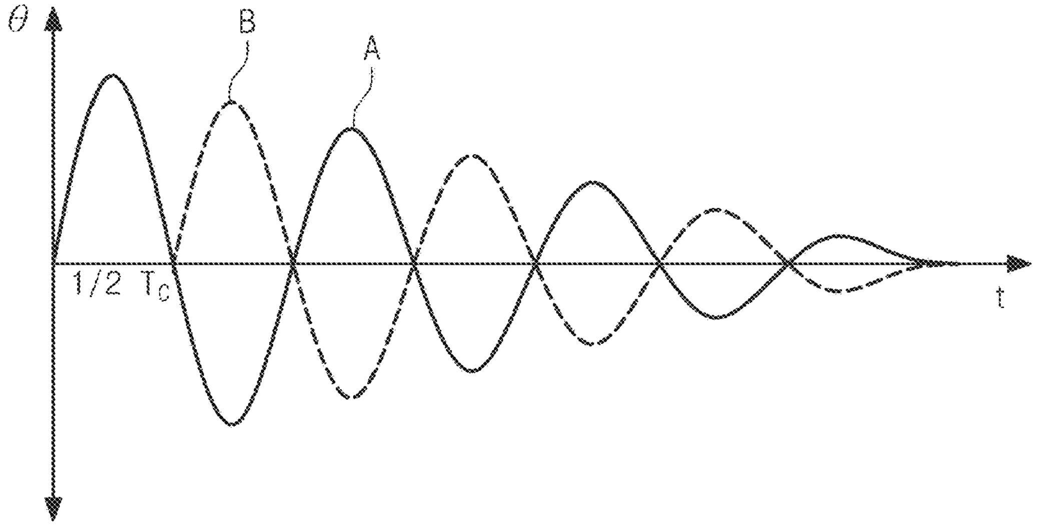
Figure 15:

The shake damping operation of the present application will be described in more detail with reference to FIGS. 13 to 15. FIG. 13 illustrates a change in the angle θ of the belt 572 when the shaking damping operation of the present application is not performed. As illustrated in FIG. 13, when the transferring unit 500 accelerates/decelerates, the angle θ of the belt 572 changes to a waveform A having one period $T_c$ due to inertia. In a general case, operations, such as gripping the container 20, should be performed after waiting until the change in the angle θ of the belt 572 is stabilized, that is, the vibration is eliminated. However, as illustrated in FIG. 14, when the shaking is generated with a smaller size after half period (½ $T_c$) of the waveform B of the same event, only the waveform R as illustrated in FIG. 15 remains. That is, the shaking damping operation of the present invention may minimize shaking occurring in the container 20 by generating the shaking with the same cycle in the container 20 again (starting to accelerate again after the constant speed traveling from $t_1$ to $t_2$, or starting to decelerate again after the constant speed traveling from $t_7$ to $t_8$) after a half cycle of the shaking period occurring in the container 20 (½ $T_c$), after an event causing shaking in the container 20 in the acceleration section S10 or deceleration section S30 (acceleration start or deceleration start).

Again, referring to FIGS. 11 and 12, in this shaking damping operation, the magnitude of the traveling acceleration of the transferring unit 500 may be changed in a half period (½ $T_c$) of the shaking period of the container 20. For example, the operation of changing the magnitude of the traveling acceleration may be an operation in which the magnitude of the traveling acceleration of the transferring unit 500 is changed from the first acceleration to 0 (constant speed traveling) at $t_1$ or $t_7$, and is changed to the second acceleration after $t_2$ or $t_8$. The second acceleration may be a speed smaller than the first acceleration. Further, the interval $t_0$ to $t_1$ may be greater than the interval $t_2$ to $t_3$. Also, the interval $t_6$ to $t_7$ may be larger than $t_8$ to $t_9$.

Also, in the belt 572 the length l of the belt 572 may be fixed in the acceleration section S10 and/or the deceleration section S30. That is, the distance from the body 510 to the grip member 580 in the acceleration section S10 and/or the deceleration section S30 may be fixed.

The change in length l of the belt 572 may be made in the constant speed section S20. In other words, the raising or lowering of the grip member 580 may be performed in the constant speed section S20. In the constant speed section S20, since the net force transmitted to the components of the transferring unit 500 is 0, even though a change in length l of the belt 572 (a change in the height of the grip member 580) is made, it is possible to suppress the occurrence of the shaking as much as possible.

In addition, when the length l of the belt 572 is changed in the acceleration section S10 and/or the deceleration section S30, the pendulum period of the grip member 580, which is a parameter of the above-described vibration damping operation, is changed, so that it fails to suppress the shaking. Accordingly, in the control method of the transferring unit 500 according to the exemplary embodiment of the present invention, the length l of the belt 572 is fixed in the acceleration section S10 and the deceleration section S30 and the length l of the belt 572 is changed in the constant speed section S20 in which the vibration damping operation is not required, thereby minimizing the occurrence of the above-described problems.

In the foregoing example, although the case where the change in length l of the belt 572 is made in the constant speed section S20 among the sections in which the transferring unit 500 travels has been described as an example, the present invention is not limited thereto. For example, when the slider 560 of the transferring unit 500 moves the lifting member 570, the traveling of the lifting member 560 of the transferring unit 500 may have an acceleration section, a constant speed section, and a deceleration section. In this case, the change in the length of the belt 572 may be made in the constant speed section among the traveling sections of the lifting member 560 of the transferring unit 500.

In the above-described example, the case where the article transferring system 1000 is applied to the semiconductor manufacturing line has been described as an example, but the present invention is not limited thereto. For example, the article transferring system 1000 may be equally or similarly applied to various manufacturing lines requiring transferring of articles.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A transferring unit traveling on a rail provided along a ceiling, the transferring unit comprising:

a body with a traveling driver;

a traveling wheel configured to be rotated by receiving power from the traveling driver;

a grip member configured to grip an article;

a lifting member between the body and the grip member, the lifting member being configured to move the grip member in a vertical direction; and a controller, wherein the lifting member includes a belt connected with the grip member; and a lifting driver configured to wind and unwind the belt, wherein the controller is configured to control the lifting member and the traveling driver to lower or raise the grip member while the transferring unit travels on the rail and the controller controls the lifting member and the traveling driver so that the lowering or raising of the grip member is performed in a constant speed section in which the transferring unit travels at a constant speed, wherein the controller is configured to control the traveling driver such that a shaking damping operation of damping shaking of the article gripped by the grip member is performed in an acceleration section in which a traveling speed of the transferring unit along the rail increases, or in a deceleration section in which the traveling speed of the transferring unit along the rail decreases, to reduce a shaking that causes a longitudinal length of the belt to deviate in any direction from a direction perpendicular to ground, wherein the shaking damping operation is an operation that includes changing a traveling acceleration of the transferring unit along the rail in a half period of a shaking period of the article, wherein the shaking damping operation is an operation that includes changing the traveling acceleration of the transferring unit from a first acceleration to a second acceleration that is smaller than the first acceleration, wherein the shaking damping operation is an operation that includes changing the traveling of the transferring unit from first acceleration traveling at the first acceleration to constant speed traveling and changing the traveling of the transferring unit from the constant speed traveling to second acceleration traveling at the second acceleration, and wherein a first time period during which the transferring unit performs the constant speed traveling is shorter than a second time period during which the transferring unit performs the first acceleration traveling or the second acceleration traveling, and wherein the controller is configured to control the traveling driver and the lifting driver such that an extended length of the belt is fixed in the acceleration section or in the deceleration section.

2. An article transferring system for transferring a container in which an article is accommodated along a ceiling of a manufacturing line in which semiconductor process devices are continuously disposed, the article transferring system comprising:

a rail provided along the ceiling;

a port configured to allow the container to be seated;

a transferring unit configured to travel along the rail and configured to transfer the container to the port, wherein the transferring unit includes, a body with a traveling driver;

a traveling wheel configured to rotate by receiving power from the traveling driver;

a grip member configured to grip the container;

a lifting member between the body and the grip member and configured to move the grip member in a vertical direction; and a controller, and wherein the lifting member includes a belt connected with the grip member; and a lifting driver configured to change an extended length of the belt by winding or unwinding the belt, wherein the controller is configured to control the lifting member and the traveling driver to lower or raise the grip member while the transferring unit travels on the rail and the controller controls the lifting member and the traveling driver so that the lowering or raising of the grip member is performed in a constant speed section in which the transferring unit travels with a traveling speed that is a constant speed, wherein the controller is configured to control controls the traveling driver so as to perform a shaking damping operation of damping shaking of the article gripped by the grip member in an acceleration section in which the traveling speed of the transferring unit increases along the rail, or a deceleration section in which the traveling speed of the transferring unit decreases along the rail, to reduce a shaking that causes a longitudinal length of the belt to deviate in any direction from a direction perpendicular to ground, wherein the shaking damping operation is an operation of changing a traveling acceleration of the transferring unit in a half period of a shaking period of the article, wherein the shaking damping operation is an operation of changing the traveling acceleration of the transferring unit from a first acceleration rate to a second acceleration rate that is smaller than the first acceleration rate, wherein the shaking damping operation is an operation of changing the traveling speed of the transferring unit from the first acceleration rate to a constant speed traveling, and changing the traveling speed of the transferring unit from the constant speed to the second acceleration rate, wherein a first time period during which the transferring unit travels at the constant speed is shorter than a second time period during which the transferring unit performs the first acceleration rate or the second acceleration rate, and wherein the controller is configured to control the traveling driver and the lifting driver such that the extended length of the belt is fixed in an acceleration section in which the traveling speed of the transferring unit along the rail increases and a deceleration section in which the traveling speed of the transferring unit decreases along the rail.

* * * * *